United States Patent [19]

Morton

[11] Patent Number: 5,014,904
[45] Date of Patent: May 14, 1991

[54] BOARD-MOUNTED THERMAL PATH CONNECTOR AND COLD PLATE

[75] Inventor: David M. Morton, Eau Claire, Wis.
[73] Assignee: Cray Research, Inc., Minneapolis, Minn.
[21] Appl. No.: 464,909
[22] Filed: Jan. 16, 1990
[51] Int. Cl.⁵ .............................................. H05K 7/20
[52] U.S. Cl. ................................. 228/176; 228/180.2; 228/123; 361/385; 361/386; 361/412; 357/82
[58] Field of Search ................... 228/176, 123, 180.2; 361/382, 385, 386, 412; 174/15.1, 16.3; 165/80.4, 185; 357/81, 82

[56] References Cited

U.S. PATENT DOCUMENTS

| | | |
|---|---|---|
| 1,641,702 | 9/1927 | Sprong . |
| 1,950,653 | 3/1934 | Best . |
| 2,643,282 | 6/1953 | Greene . |
| 2,917,685 | 12/1959 | Wiegand . |
| 2,948,518 | 8/1960 | Kraus . |
| 3,065,384 | 11/1962 | Sprude . |
| 3,070,729 | 12/1962 | Heidler . |
| 3,141,999 | 7/1964 | Schneider . |
| 3,198,991 | 8/1965 | Barnett . |
| 3,268,772 | 8/1966 | Kamei et al. . |
| 3,270,250 | 8/1966 | Davis . |
| 3,334,684 | 8/1967 | Roush et al. . |
| 3,417,814 | 12/1968 | Oktay . |
| 3,466,189 | 9/1969 | Erb . |
| 3,504,268 | 3/1970 | Hoffman et al. . |
| 3,512,582 | 5/1970 | Chu et al. . |
| 3,527,989 | 9/1970 | Cuzner et al. . |
| 3,586,959 | 6/1971 | Eccles et al. . |
| 3,630,273 | 12/1971 | La Haye et al. . |
| 3,631,325 | 12/1971 | Wenz . |
| 3,648,113 | 3/1972 | Rathjen et al. . |
| 3,741,292 | 6/1973 | Aakalu et al. . |
| 3,812,402 | 5/1974 | Garth . |
| 3,851,221 | 11/1974 | Beaulieu et al. . |
| 3,865,183 | 2/1975 | Roush . |
| 4,072,188 | 2/1978 | Wilson et al. . |
| 4,120,021 | 10/1978 | Roush . |
| 4,204,247 | 5/1980 | Wigley . |
| 4,283,754 | 8/1981 | Parks . |
| 4,302,793 | 11/1981 | Rohner . |
| 4,383,270 | 5/1983 | Schelhorn . |
| 4,420,739 | 12/1983 | Herren . |
| 4,514,784 | 4/1985 | Williams et al. . |
| 4,535,385 | 8/1985 | August et al. . |
| 4,628,407 | 12/1986 | August et al. . |
| 4,720,770 | 1/1988 | Jameson . |
| 4,772,980 | 9/1988 | Curtis et al. . |
| 4,884,168 | 11/1989 | August et al. ............... 361/385 |

FOREIGN PATENT DOCUMENTS

| | | |
|---|---|---|
| 1210519 | 8/1986 | Canada . |
| 1212173 | 9/1986 | Canada . |
| 0055578 | 7/1982 | European Pat. Off. . |
| 0129966 | 2/1988 | European Pat. Off. . |
| 140637 | 11/1981 | Japan ................. 228/180.2 |
| 94749 | 5/1985 | Japan ................. 228/180.2 |
| 839083 | 6/1981 | U.S.S.R. . |

OTHER PUBLICATIONS

IBM Technical Disclosure Bulletin, vol. 8, No. 10, Mar. 1966, pp. 1460, 1461.
IBM Technical Disclosure Bulletin, vol. 10, No. 10, Mar. 1968, pp. 1559, 1560.
IBM Technical Disclosure Bulletin, vol. 13, No. 7, Dec. 1970, p. 2029.
IBM Technical Disclosure Bulletin, vol. 13, No. 1, Jun. 1970, G. O. Tiffany.
IBM Technical Disclosure Bulletin, vol. 20, No. 9, Feb. 1978, pp. 3727, 3728.
1989 National Heat Transfer Conference, HTD, vol. 111, Heat Transfers in Electronics, pp. 143–148.
IBM Technical Disclosure Bulletin, vol. 21, No. 9, Feb. 1979, p. 3591.

Primary Examiner—Sam Heinrich
Attorney, Agent, or Firm—Merchant, Gould, Smith, Edell, Welter, & Schmidt

[57] ABSTRACT

The present invention discloses an improved method and apparatus for dissipating heat from printed circuit boards and electronic devices mounted thereon. Printed circuit boards are provided with apertures therethrough for receiving thermal conductor pads. The thermal conductor pads may be secured in the apertures through the use of glue or by means of an interference fit. Glue may also be deposited on top of the thermal conductor pad to secure an electronic device thereto. The glue is cured in a manner that limits its thickness to a minimum value. The electronic device may be further secured to the printed circuit board by wave soldering. The opposite end of the thermal conductor pad contacts the cold plate.

15 Claims, 3 Drawing Sheets

BOARD-MOUNTED THERMAL PATH CONNECTOR AND COLD PLATE

FIELD OF THE INVENTION

The present invention relates generally to a cold plate adapted for use with printed circuit board assemblies to provide enhanced heat dissipation, and more particularly, to a thermal conductor pad mounted in a printed circuit board, thereby providing a thermally conductive path between electronic devices mounted on the printed circuit board and the cold plate on which the printed circuit board itself is mounted.

BACKGROUND OF THE PRIOR ART

In the field of high-speed computers, high-density, high-speed electronic devices exhibit above-average power consumption characteristics. Such power consumption leads to extreme heat generation. A cooling apparatus must be able to efficiently dissipate heat from the electronic devices.

The co-pending and commonly assigned U.S. patent application Ser. No. 07/284,992, filed Dec. 14, 1988, by August et al., entitled "COOLING PLATE WITH INTERBOARD CONNECTOR APERTURES FOR CIRCUIT BOARD ASSEMBLIES", describes a cooling plate for heat dissipation that is particularly adapted for use with stacks of printed circuit boards. The cooling plate includes apertures and mounting means for Z-axis connector assemblies so that printed circuit boards attached to either side of the cooling plate may be electrically interconnected. Externally, the cooling plate has a fixed pattern of the heat conductive pads that are substantially identical to the pattern of devices on a printed circuit board attached to the cooling plate. The use of such fixed patterns prevent specific cooling plates from being used with more than one configuration of printed circuit board. Each printed circuit board has a different pattern of devices thereon, and thus requires a different cooling plate. In addition, careful manufacturing of the cooling plate and equally careful mounting of devices on the printed circuit board is required to ensure optimal heat dissipation.

The commonly assigned U.S. Pat. No. 4,628,407, issued Dec. 9, 1986, to August et al., entitled "CIRCUIT MODULE WITH ENHANCED HEAT TRANSFER AND DISTRIBUTION", describes a printed circuit board used in a high performance computer. A printed circuit board stack is disclosed which includes a heat-conducting plate situated therein. The printed circuit boards contain thermally conductive paths from each circuit device mounted thereon through the printed circuit board to locations in contact with the cooling plate. This system provides good heat dissipation properties, but tolerance variations in the thickness of the printed circuit board can affect the thickness of the thermal compound between the thermal connector and the circuit device.

SUMMARY OF THE INVENTION

To overcome the limitations in the prior art described above, and to overcome other limitations that will become apparent upon reading and understanding the present specification, the present invention discloses an improved method and apparatus for dissipating heat from printed circuit boards and electronic devices mounted thereon. The printed circuit board has an aperture therethrough for receiving a thermal conductor pad. The pad may be secured in the printed circuit board by means of glue or a press fit. Glue may be deposited on top of the pad to secure and provide a thermal path from an electronic device to the pad. The glue is cured in a manner that limits its thickness to a minimum value. A wave soldering process, or other method of attachment, is used to further secure the electronic device to the printed circuit board. The end of the thermal conductor pad adjacent the cold plate provides a large nickel-plated surface area for contacting the cold plate. The interface between the pad and the cold plate may be metal-to-metal or it may be filled with a thermal grease or other thermally conductive material.

The present invention provides improved thermal characteristics over prior art cold plates. Variations in the thickness of printed circuit boards no longer affect heat dissipation. The installation process ensures that the thermal interface between the thermal conductor pad and the electronic device is minimized.

Manufacturing and assembly advantages are simplified using the present invention. The cost of creating custom bump patterns is eliminated by manufacturing the cold plates with smooth generic surfaces. Thus, generic cold plates can be fitted to any number of differently configured printed circuit boards. In addition, careful alignment of the printed circuit boards on the cold plate is no longer necessary.

Because the thermal conductor pad is removable from the cold plate, the present invention also provides for simpler inspection and repair. Printed circuit boards can be easily removed from the cold plate, in contrast to prior art cold plates with bump patterns thereon where the printed circuit boards are often glued to the cold plate to ensure proper heat transfer.

The present invention also provides a significantly improved method for attaching power and ground connections to the printed circuit boards via the cold plate.

DESCRIPTION OF THE DRAWINGS

In the drawings, where like numerals refer to like elements throughout the several views.

DESCRIPTION OF THE PREFERRED EMBODIMENT

In the following detailed description of the preferred embodiment, reference is made to the accompanying drawings which form a part hereof and in which is shown by way of illustration a preferred embodiment in which the invention may be practiced. It is to be understood that other embodiments may be utilized and that structural changes may be made without departing from the scope of the present invention.

The present invention discloses an improved method and apparatus for dissipating heat from printed circuit boards and electronic devices mounted thereon. In the present invention, printed circuit boards are provided with apertures therethrough for receiving thermal conductor pads. The thermal conductor pads are engaged in the aperture of the printed circuit board by means of a press fit or glue. Glue is deposited on the top surface of the thermal conductor pad to secure the electronic device thereon and to provide a better thermal path. The electronic device is first aligned and then pressed onto the top surface of the thermal conductor pad, thereby securing the electronic device to the thermal conductor pad. The glue is cured in a manner (e.g., with force applied to the electronic device) that limits its thickness to a minimum value. Wave soldering, or other means of attachment, further secures the electronic device to the printed circuit board.

The opposite end of the thermal conductor pad contacts the cold plate. This interface between the thermal conductor pad and the cold plate may be an interference fit or a thermal grease interface.

Figure 1:
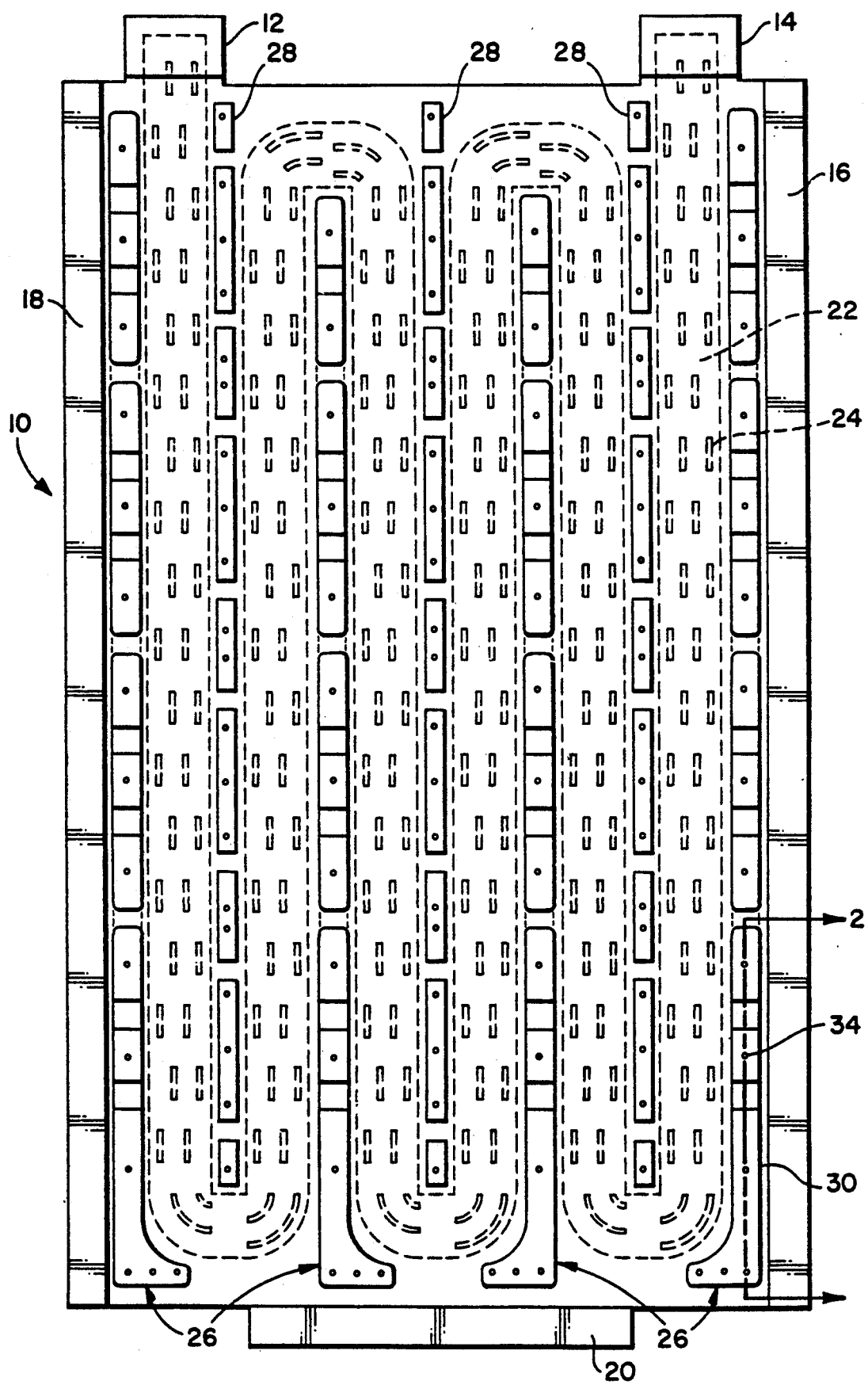
FIG. 1 is a top view of a cold plate in accordance with the present invention.

In FIG. 1, a cold plate 10 is described, wherein elements with solid outlines are external features of the cold plate 10 and elements with dotted outlines are internal features of the cold plate 10. The cold plate 10 is similar in construction to that described in the co-pending and commonly assigned application Ser. No. 07/284,992, filed Dec. 14, 1988, by August et al., entitled "COOLING PLATE WITH INTERBOARD CONNECTOR APERTURES FOR CIRCUIT BOARD ASSEMBLIES", which application is hereby incorporated by reference. The cold plate 10 contains a fluid inlet manifold 12, fluid passages 22, and a fluid outlet manifold 14. Interspersed throughout all the fluid passages 22 are a plurality of heat-dissipating fins 24. Mounted along the edges 16 and 18 of the cold plate 10 are zero-insertion-force (ZIF) edge connectors (not shown) of the type described in the co-pending and commonly assigned application Ser. No. 07/351,871, filed May 12, 1989, by August et al., entitled "TWO PIECE ZIF CONTROL WITH SLIDING BLOCK", which application is hereby incorporated by reference. Flange 20 on the end of the cold plate 10 contains threaded bolt holes (not shown) for mounting the cold plate 10 and attached printed circuit boards to the ground contact shown in FIG. 3. The cold plate 10 is also comprised of a plurality of power busses 26 and ground conductor strips 28. The ground conductor strips 28 are an integral part of surface of the cold plate 10. The power busses 26 reside in apertures 30 of the cold plate 10 and are sandwiched within the cold plate 10 by the printed circuit boards on either side. The power busses 26 and ground conductor strips 28 make contact with corresponding electrical strips on the printed circuit boards. These strips on the printed circuit boards, which complete the electrical circuits when in contact with the power busses 26 and ground conductor strips 28, are shown in more detail in FIG. 5. The cold plate 10, power busses 26, ground conductor strips 28, and apertures 30 are all coated with an insulating finish in the area where electrical contact is not desired.

Figure 2:
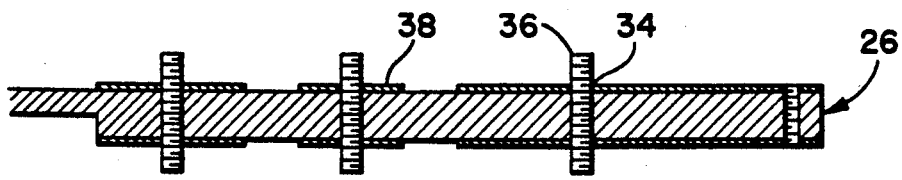
FIG. 2 is a cross-sectional side view of the bus of FIG. 1.

FIG. 2 is a cross-sectional side view of the power bus 26. Portions 38 of the power bus 26 are used to contact the corresponding strips on the printed circuit boards. Printed circuit boards are attached to the cold plate 10 by means of spacers/connectors 36 mounted through apertures 34. Printed circuit boards may be attached on both sides of the cold plate 10.

Figure 3:
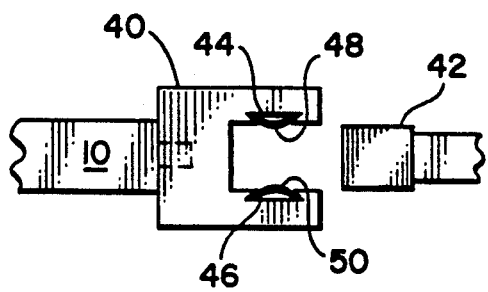
FIG. 3 is a cross-sectional side view of a dovetail socket connector mounted on the edge of the cold plate.
Figure 4:
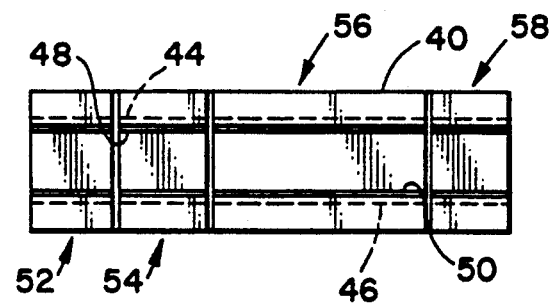
FIG. 4 is a front view of the dovetail socket connector of FIG. 3.

FIG. 3 is a cross-sectional side view of a dovetail socket connector 40 mounted on an edge of the cold plate 10. FIG. 4 is a front view of the dovetail socket connector 40 of FIG. 3. In the preferred embodiment, electrically discontinuous areas 52, 54, 56, and 58 along the length of the dovetail socket 40 make electrical contact with the respective power and ground contacts 26 and 28. The dovetail socket 40 then makes contact with connector 42, which also has electrical discontinuities along its length. Grooves 44 and 46 are cut in opposing faces of the dovetail socket connector 40. The grooves 44 and 46 are transverse to the direction of insertion of a connector 42. Conductor strips 48 and 50 are mounted in these grooves 44 and 46, respectively, and contact power busses (not shown) or ground conductors (not shown) on either side of the connector 42. Thus, the arrangement results in a low-insertion-force power and ground plug system.

Those skilled in the art will recognize that an alternative embodiment could use the cold plate 10 as the connector 42 with the dovetail socket connector 40 mounted on another element. In such an alternative embodiment, the power busses 26 and ground conductor strips 28 in the cold plate 10 would make electrical contact with the conductor strips 48 and 50 when the cold plate 10 was inserted into the dovetail socket connector 40.

Figure 5:
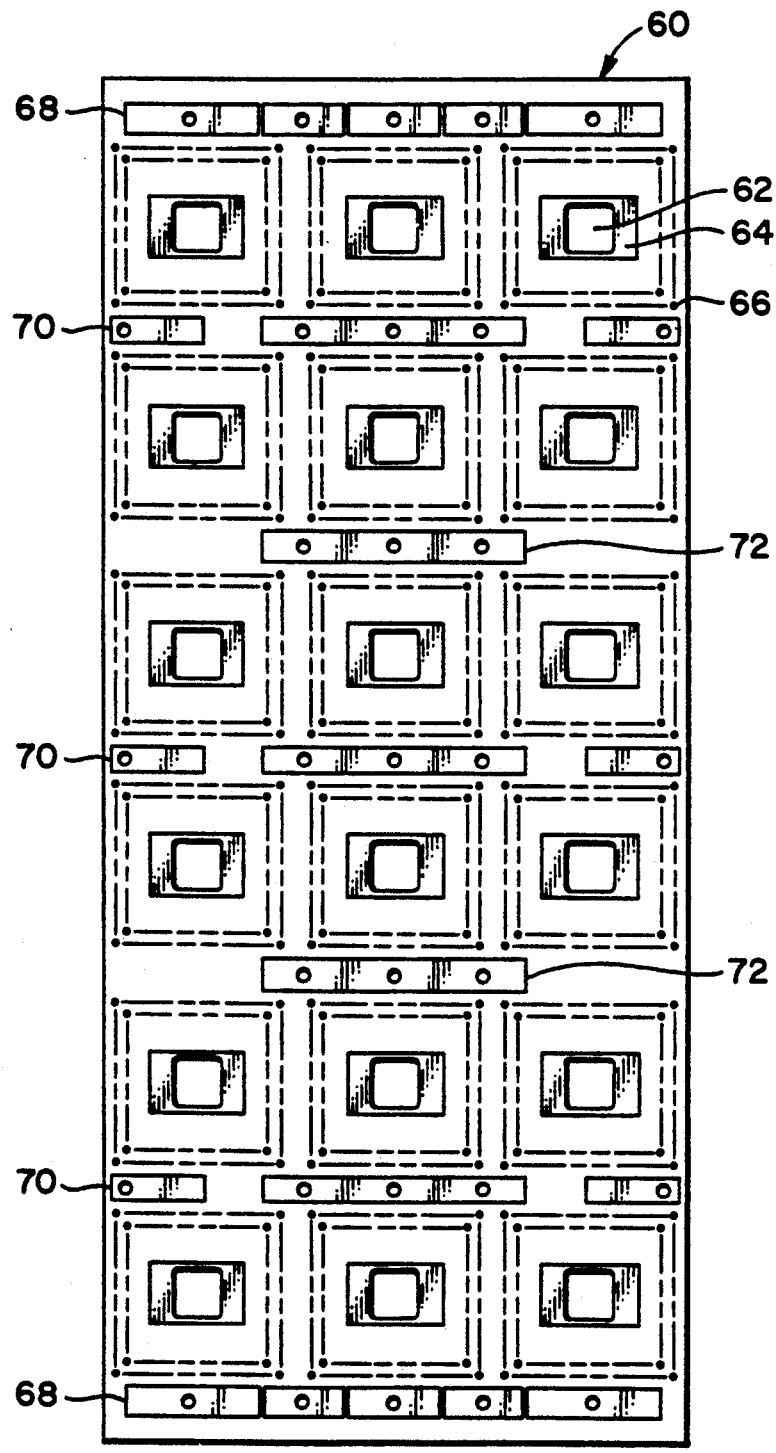
FIG. 5 is a top view of a printed circuit board mounted on the cold plate.

FIG. 5 is a top view of a printed circuit board 60 used in the preferred embodiment, also referred to as a quarter-board because it covers one-quarter of the surface area of the cold plate 10. Printed circuit boards 60 are symmetrical with regard to the cold plate 10, and the power busses 26 and ground conductor strips 28 thereof, and may be rotated 180 degrees on the cold plate 10 and still make the correct electrical contact with the power busses 26 and ground conductor strips 28. The printed circuit board 60 has strips 68, 70, and 72 that contact the power busses 26 and ground conductor strips 28 on the cold plate 10 to complete the electrical circuits supplying power to the electrical devices mounted on the printed circuit board 60. FIG. 5 also shows the apertures 62 in the printed circuit board 60 where the thermal conductors are mounted. The apertures 62, and the surrounding area 64, may be plated-through for improved thermal conductivity. Surrounding the apertures 62 are electrical vias 66 for signal, power, and ground signals for the electronic device mounted over the aperture 62.

Figure 6:
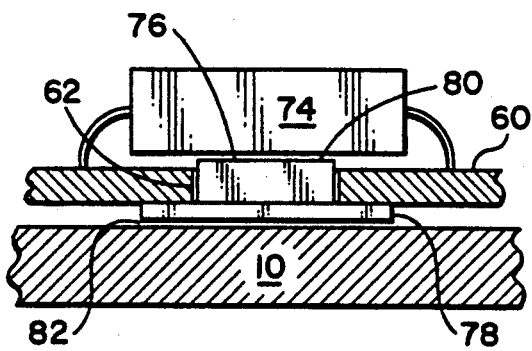
FIG. 6 is a cross-sectional side view of the thermal conductor pad mounted in an aperture of the printed circuit board and abutting both the cold plate and the electronic device.

FIG. 6 is cross-sectional side view of a thermal conductor pad 76 mounted in an aperture 62 of the printed circuit board 60. The thermal conductor pad 76 is pushed up through the aperture 62 until flush with the surface of the printed circuit board 60 or extending slightly therefrom. The thermal conductor pad 76 may be secured in the aperture 62 by means of the press fit or glue. Glue is deposited on the top surface 80 of the thermal conductor pad 76 to secure the electronic device 74 thereon and to provide a better thermal path. The electronic device 74 is first aligned and then pressed onto the top surface 80 of the thermal conductor pad 76, thereby securing the electronic device 74 to the thermal conductor pad 76. The glue is cured in a manner (e.g., with force applied to the electronic device 74) that limits its thickness to a minimum value. Wave soldering, or other means of attachment, further secures the electronic device 74 to the printed circuit board 60. A large nickel-plated surface area 78 of the thermal conductor pad 76 provides for enhanced contact with the cold plate 10. A thermal grease or other thermally conductive material may be applied to the interface 82 to enhance the heat sink properties of the apparatus. Alternatively, the thermal conductor pad 76 may directly abut the cold plate 10.

Figure 7:
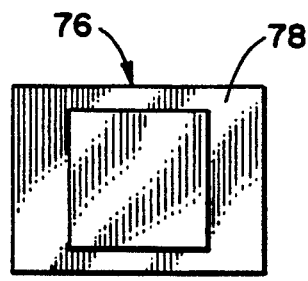
FIG. 7 is a top view of the thermal conductive pad of FIG. 6.

FIG. 7 is a top view of the thermal conductor pad 76. The thermal conductor pad 76 is generally rectangular in shape and comprised of a suitable thermally conductive material. The large nickel-plated surface area 78 provides for enhanced thermal contact with the cold plate 10. Thus, the thermal conductor pad 76 provides an improved heat sink flow path from the electronic device 74 to the cold plate 10.

As illustrated herein, the present invention provides improved thermal characteristics over prior art cold plates. Variations in the thickness of printed circuit boards do not affect heat dissipation performance. In addition, the thermal conductor pad provides a large nickel-plated surface area for contacting the cold plate. An interference fit ensures that the thermal interface between the thermal conductor pad and the cold plate is minimized. Alternatively, a thermal grease may fill the interface between the thermal conductor pad and the cold plate so that the thermal resistance is minimized.

Manufacturing and assembly advantages are simplified using the present invention. The cost of creating custom bump patterns is eliminated by manufacturing the cold plates with smooth generic surfaces. Thus, generic cold plates can be fitted to any number of differently configured printed circuit boards. In addition, careful alignment of the printed circuit boards on the cold plate is no longer necessary.

Because the thermal conductor pad is removable from the cold plate, the present invention also provides for simpler inspection and repair. Printed circuit boards can be easily removed from the cold plate assembly, in contrast to prior art cold plates with bump patterns thereon where the devices mounted onto the printed circuit boards are often glued to the thermal bumps which are an integral part of the cold plate to ensure proper thermal characteristics.

The present invention also provides a significantly improved method for attaching power and ground connections to the printed circuit boards via the cold plate.

Although a preferred embodiment has been illustrated and described for the present invention, it will be appreciated by those of ordinary skill in the art that any apparatus which is calculated to achieve the same purpose may be substituted for the specific configuration shown. This application is intended to cover any adaptations or variations of the present invention. Therefore, it is manifestly intended that this invention be limited only by the claims and the equivalents thereof.

What is claimed is:

1. A heat dissipation apparatus for electronic devices, comprising:
    at least one printed circuit board with a cold plate mounted adjacent thereto;
    at least one aperture through said printed circuit board;
    at least one thermal conductor pad engaged in said aperture; and
    means for specifying an interference fit between said thermal conductor pad and said cold plate such that a thermal interface therebetween is minimized.

2. The apparatus of claim 1, further comprising means for press fitting said thermal conductor pad into said aperture such that variations in the thickness of said printed circuit boards no longer effect a thermal interface between said thermal conductor pad and the electronic device.

3. The apparatus of claim 1, further comprising means for gluing said thermal conductor pad into said aperture.

4. The apparatus of claim 1, further comprising means for gluing the electronic device onto said thermal conductor pad such that said thermal conductor pad and the electronic device are self-aligning.

5. A method of installing a thermal conductor pad in a thermal path of a printed circuit board, comprising:
    engaging the thermal conductor pad in an aperture of the printed circuit board;
    depositing glue to a top surface of the thermal conductor pad; and
    aligning and pressing an electronic device onto said top surface of the thermal conductor pad such that said electronic device is aligned with the thermal conductor pad and said electronic device is secured to the printed circuit board.

6. The method of claim 5, further comprising selectively wave soldering said electronic device to further secure it to the printed circuit board.

7. The method of claim 5, wherein the engaging step comprises press fitting the thermal conductor pad into said aperture of the printed circuit board.

8. The method of claim 5, wherein the engaging step comprises gluing the thermal conductor pad into said aperture of the printed circuit board.

9. A heat dissipation apparatus for electronic devices comprising a cold plate adjacent a printed circuit board, at least one aperture through the printed circuit board, and at least one self-fixturing thermal conductor pad, wherein the apparatus is constructed by the steps of:
    engaging the thermal conductor pad in the aperture of the printed circuit board;
    depositing glue to a top surface of the thermal conductor pad; and
    pressing the electronic device onto said top surface of the thermal conductor pad such that the thermal conductor pad and the electronic device are aligned and the electronic device is secured to the printed circuit board.

10. The apparatus of claim 9, further comprising selectively wave soldering the electronic device to secure it to the printed circuit board.

11. The apparatus of claim 9, wherein the engaging step comprises press fitting the thermal conductor pad into the aperture such that variations in the thickness of the printed circuit board no longer effects a thermal interface between the thermal conductor pad and the electronic device.

12. The apparatus of claim 9, wherein the engaging step comprises gluing the thermal conductor pad into the aperture.

13. A power distribution apparatus for electronic devices, comprising:
    a cold plate;
    at least one power bus mechanically connected to a surface of said cold plate;

at least one ground conductor strip mechanically connected to a surface of said cold plate;

a printed circuit board with the electronic devices mounted thereon;

at least one power bus mechanically connected to a surface of said printed circuit board and disposed thereon to electrically connect with said cold plate power bus when said printed circuit board is mechanically connected to said cold plate;

at least one ground conductor strip mechanically connected to a surface of said printed circuit board and disposed thereon to electrically connect with said cold plate ground conductor strip when said printed circuit board is mechanically connected to said cold plate;

means for electrically connecting said printed circuit board power busses and ground conductor strips to the electronic devices mounted on said printed circuit board; and means for electrically connecting said cold plate power busses and ground conductor strips to an external electrical circuit.

14. The apparatus of claim 13, wherein the means for electrically connecting said cold plate power busses and ground conductor strips to said external electrical circuit, comprises:

a connector mounted on said cold plate, and electrically connected to said cold plate power busses and ground conductor strips; and means for accepting a member into said connector such that said cold plate power busses and ground conductor strips are electrically connected to said external electrical circuit on said member.

15. The apparatus of claim 13, wherein the means for electrically connecting said cold plate power busses and ground conductor strips to said external electrical circuit, comprises:

a connector; and means for accepting an edge of said cold plate into said connector such that said cold plate power busses and ground conductor strips are electrically connected to an external power electrical circuit.

* * * * *